(12) United States Patent  (10) Patent No.: US 9,812,084 B2
Kim et al.  (45) Date of Patent: Nov. 7, 2017

(54) DISPLAY APPARATUS INCLUDING A PLURALITY OF FLEXIBLE PRINTED CIRCUIT BOARDS

(71) Applicant: SAMSUNG DISPLAY CO., LTD., Yongin, Gyeonggi-Do (KR)

(72) Inventors: Kyung-Ha Kim, Gyeonggi-do (KR); Ji-Hyun Kim, Gyeonggi-do (KR); Sun-Kyu Son, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 29 days.

(21) Appl. No.: 14/600,042

(22) Filed: Jan. 20, 2015

(65) Prior Publication Data

US 2016/0027398 A1 Jan. 28, 2016

(30) Foreign Application Priority Data

Jul. 25, 2014 (KR) ........................ 10-2014-0094989

(51) Int. Cl.
*G09G 5/00* (2006.01)
*G09G 3/20* (2006.01)
*H05K 3/36* (2006.01)

(52) U.S. Cl.
CPC ................. *G09G 5/00* (2013.01); *G09G 3/20* (2013.01); *G09G 3/2092* (2013.01); *H05K 3/361* (2013.01); *G09G 2300/0426* (2013.01); *G09G 2310/0281* (2013.01)

(58) Field of Classification Search
CPC .......... G09G 5/00; G09G 3/20; G09G 3/2092; G09G 2300/0426; G02F 1/13; H01L 27/32; H05K 3/361

USPC .......................................................... 345/212
See application file for complete search history.

(56) References Cited

U.S. PATENT DOCUMENTS 6,469,252 B1 * 10/2002 Tanaka ................. B60R 16/027
                                                174/117 F
2004/0012744 A1 * 1/2004 Ishige ................... G02F 1/1345
                                                349/139
2005/0083742 A1    4/2005 Hwang et al.
2008/0088768 A1    4/2008 Kohno
(Continued)

FOREIGN PATENT DOCUMENTS

JP    2013-134265      7/2013
KR   1020110066053     6/2011
KR   1020130081506     7/2013

OTHER PUBLICATIONS

Anonymous; "Flexible Circuit Design Guide", Internet Citation, Jan. 31, 2000, pp. 1-81, XP002691486.
(Continued)

*Primary Examiner* — Stephen Sherman
(74) *Attorney, Agent, or Firm* — F. Chau & Associates, LLC (57) ABSTRACT

A display apparatus is provided. The display apparatus includes a display panel and a plurality of flexible printed circuit boards. The display panel includes a gate line and a data line. The plurality of flexible printed circuit boards is connected to one side of the display panel. Each of the plurality of flexible printed circuit board includes a gate driving chip configured to apply a gate signal to the gate line and a source driving chip configured to apply a data voltage to the data line.

19 Claims, 8 Drawing Sheets (56) References Cited

U.S. PATENT DOCUMENTS

2008/0273003 A1* 11/2008 Jeon .................. G09G 3/3666
345/99
2014/0168553 A1 6/2014 Park et al.

OTHER PUBLICATIONS

Anonymous; "Sectional Design Standard for Flexible Printed Boards", Internet Citation, Nov. 30, 1998, pp. 1-35, XP02691487.
European Search Report for corresponding European Patent Application No. 15167097.3 dated Dec. 10, 2015.

* cited by examiner

DISPLAY APPARATUS INCLUDING A PLURALITY OF FLEXIBLE PRINTED CIRCUIT BOARDS

CROSS-REFERENCE TO RELATED APPLICATION

This application claims priority under 35 U.S.C. §119 to Korean Patent Application No. 10-2014-0094989, filed on Jul. 25, 2014 in the Korean Intellectual Property Office KIPO, the disclosure of which is incorporated by reference in its entirety.

TECHNICAL FIELD

The present inventive concept relates to a display apparatus.

DISCUSSION OF RELATED ART

Generally, a display apparatus includes a display panel and a display panel driver. The display driver may be disposed within a bezel portion of the display panel.

SUMMARY

According to an exemplary embodiment, a display apparatus is provided. The display apparatus includes a display panel and a plurality of flexible printed circuit boards. The display panel includes a gate line and a data line. The plurality of flexible printed circuit boards is connected to one side of the display panel. Each of the plurality of flexible printed circuit board includes a gate driving chip configured to apply a gate signal to the gate line and a source driving chip configured to apply a data voltage to the data line.

According to an exemplary embodiment of the present inventive concept, a display apparatus is provided. The display apparatus includes a display panel, a plurality of flexible circuit boards and a printed circuit board. The display panel includes a gate line and a data line, The plurality of flexible printed circuit boards is connected to one side of the display panel. Each of the plurality of flexible printed circuit board includes a gate driving chip configured to apply a gate signal to the gate line and a source driving chip configured to apply a data voltage to the data line. A printed circuit board is configured to apply a gate control signal to the gate driving chip and a data control signal to the source driving chip. The printed circuit board is connected to the plurality of flexible printed circuit boards. The plurality of flexible printed circuit boards is disposed between the printed circuit board and the display panel. The display panel, the plurality of flexible printed circuit boards and the printed circuit board are arranged in a first direction, and each of the plurality of flexible printed circuit boards is arranged in a second direction crossing the first direction.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings. Hereinafter, the present inventive concept will be described in detail with reference to the accompanying drawings.

Figure 1:
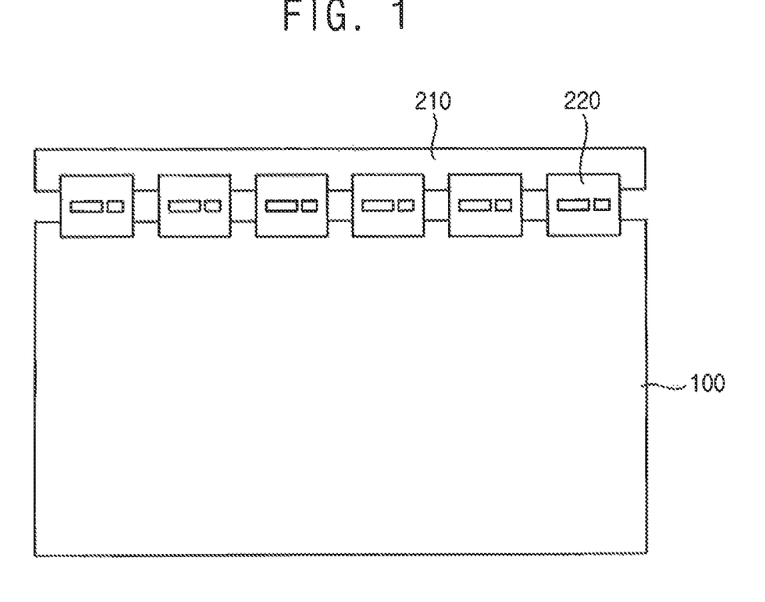
FIG. 1 is a plan view illustrating a display apparatus according to an exemplary embodiment of the present inventive concept.

FIG. 1 is a plan view illustrating a display apparatus according to an exemplary embodiment of the present inventive concept.

Referring to FIG. 1, the display apparatus includes a display panel 100 and a panel driver. The panel driver includes a printed circuit board ("PCB") 210 and a plurality of flexible printed circuit board ("FPC") 220.

The display panel 100 displays an image. The display panel 100 includes a plurality of gate lines, a plurality of data lines and a plurality of pixels connected to the gate lines and the data lines.

Each pixel includes a switching element (not shown), a liquid crystal capacitor (not shown) and a storage capacitor (not shown). The liquid crystal capacitor and the storage capacitor are electrically connected to the switching element. The pixels may be disposed in a matrix form.

Figure 2:
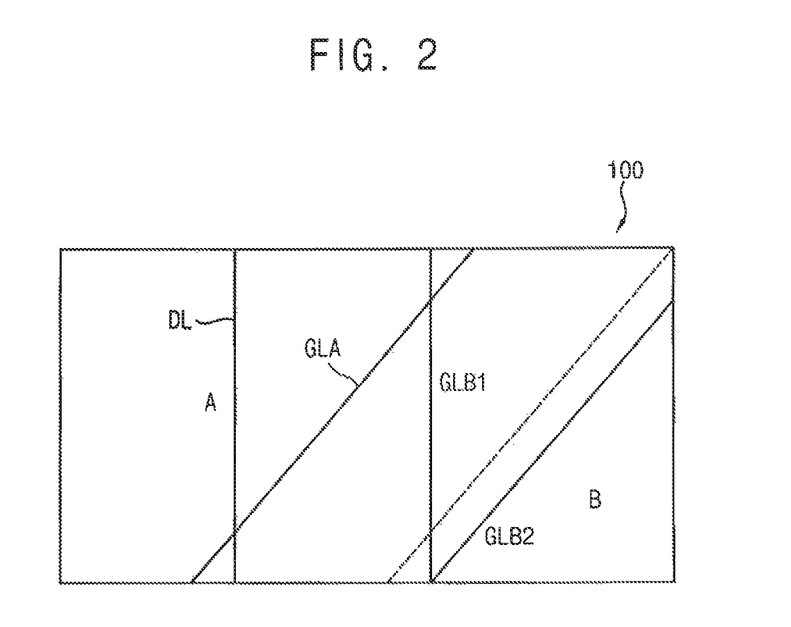
FIG. 2 is a plan view illustrating a display panel of FIG. 1.

A structure of the display panel 100 is described referring to FIG. 2 in detail.

A first side of the flexible printed circuit board 220 is connected to the display panel 100. A second side of the flexible printed circuit board 220 is connected to the printed circuit board 210.

The flexible printed circuit board 220 includes a flexible material. The flexible printed circuit board 220 may cover the side surface of the display panel 100, and the printed circuit board 210 may be bended toward a lower surface of the display panel 100, covering the side surface of the display panel 100.

For example, the flexible printed circuit board 220 is disposed on an upper side of the display panel 100.

The flexible printed circuit board 220 includes both of a gate driving chip and a source driving chip. Thus, the gate driving chip and the source driving chip are disposed in a same direction with respect to the display panel 100.

A structure of the flexible printed circuit board 220 will be described referring to FIGS. 3 to 5 in detail.

The printed circuit board 210 may include a timing controller. The timing controller receives input image data and an input control signal from an external apparatus. The input image data may include red image data, green image data and blue image data. The input control signal may include a master clock signal and a data enable signal. The input control signal may further include a vertical synchronizing signal and a horizontal synchronizing signal.

The timing controller generates a gate control signal, a data control signal and data based on the input image data and the input control signal.

The timing controller generates the gate control signal for controlling an operation of the gate driving chip based on the input control signal, and outputs the gate control signal to the gate driving chip. The gate control signal may include a vertical start signal and a gate clock signal.

The timing controller generates the data control signal for controlling an operation of the source driving chip based on the input control signal, and outputs the data control signal to the source driving chip. The data control signal may include a horizontal start signal and a load signal.

The timing controller generates the data signal based on the input image data. The timing controller outputs the data signal to the source driving chip.

The gate driving chip generates gate signals to drive the gate lines in response to a first control signal received from the timing controller. The gate driving chip sequentially outputs the gate signals to the gate lines.

The gate driving chip may be connected to the display panel 100 as a tape carrier package (TCP) type.

The source driving chip receives the data control signal and the data signal from the timing controller, and receives gamma reference voltages from a gamma reference voltage generator. The source driving chip converts the data signal into data voltages having an analog type using the gamma reference voltages. The source driving chip outputs the data voltages to the data lines.

The source driving chip may be connected to the display panel 100 in a TCP type.

FIG. 2 is a plan view illustrating the display panel 100 of FIG. 1.

Referring to FIGS. 1 and 2, the gate driving chip and the source driving chip may be disposed adjacent to an upper portion of the display panel 100.

The display panel 100 is divided into a first area A and a second area B. The first area A is defined as a left and upper portion of an inclined dotted line extending from a right vertex of an upper side of the display panel 100 to a lower side of the display panel 100. The second area B is defined as a right and lower portion of the inclined dotted line.

The first area A is driven by a first gate line group GLA extending in an inclined direction. The second area B is driven by a second gate line group GLB1 extending in a vertical direction and a third gate line group CLB2 connected to the second gate line group and extending in the inclined direction from an end portion of the second gate line group. The second gate line group GLB1 is connected, at the lower side of the display panel 100, to the third gate line group GLB2.

For example, a gate line in the first gate line group and a gate line in the third gate line group may extend stepwise.

The data lines DL of the display panel 100 may extend in a vertical direction in both areas, the first and second areas A and B of the display panel.

Figure 3:
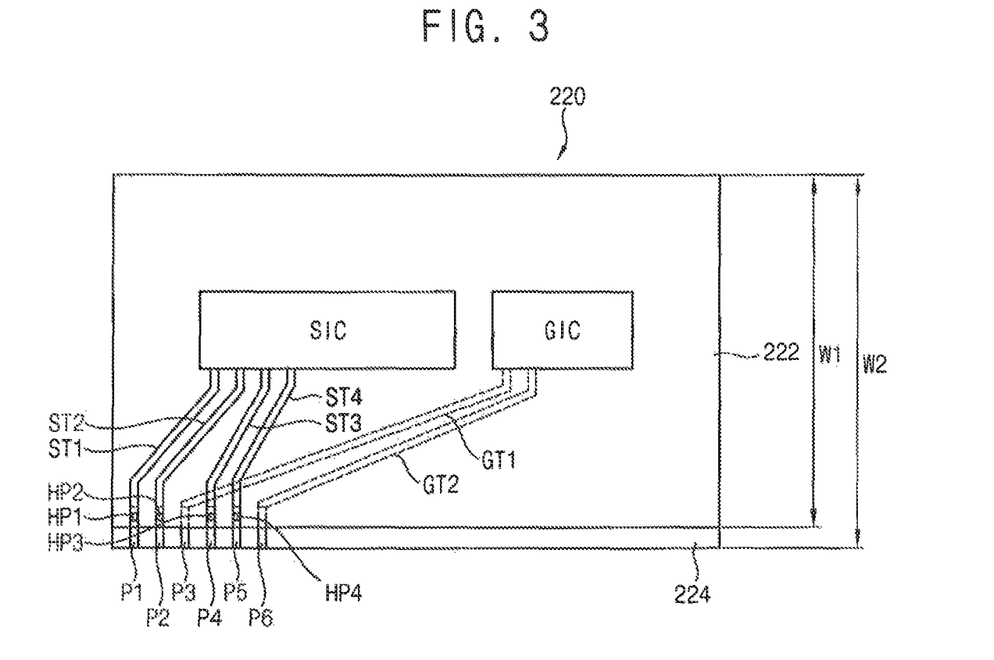
FIG. 3 is a plan view illustrating a flexible printed circuit board of FIG. 1.
Figure 4:
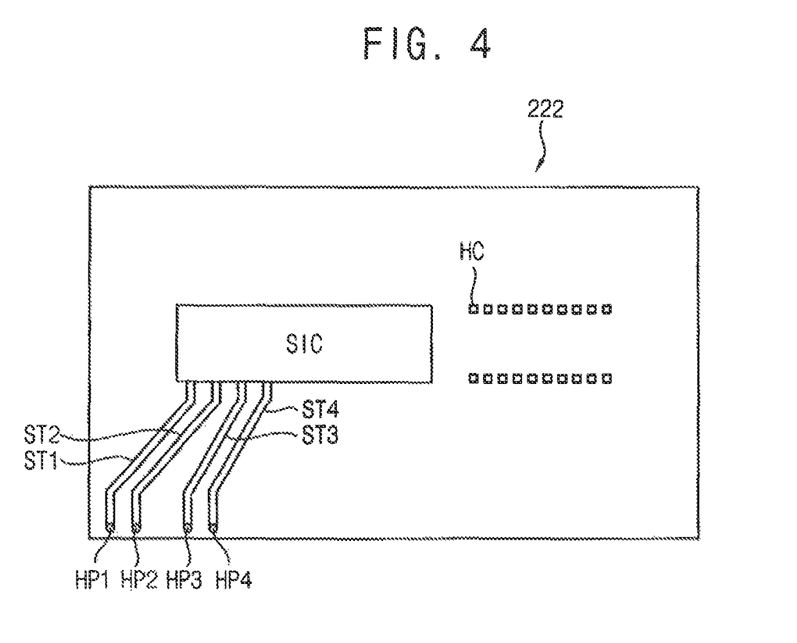
FIG. 4 is a plan view illustrating a first layer of FIG. 3.

FIG. 3 is a plan view illustrating the flexible printed circuit board 220 of FIG. 1, FIG. 4 is a plan view illustrating a first layer 222 of FIG. 3. FIG. 5 is a plan view illustrating a second layer 224 of FIG. 3.

Referring to FIGS. 1 to 5, the flexible printed circuit board 220 includes the first layer 222 and the second layer 224. A first signal transmitting line group ST1, ST2, ST3 and ST4 are disposed on the first layer 222. A second signal transmitting line group GT1 and GT2 and a pad part P1, P2, P3, P4, P5 and P6 are disposed on the second layer 224. The pad part P1 to P6 is connected to the display panel 100.

The first signal transmitting line group ST1, ST2, ST3 and ST4 is disposed on an upper surface of the first layer 222. The upper surface of the first layer 222 faces toward the printed circuit board 210. The second signal transmitting line group GT1 and GT2 and the pad part P1, P2, P3, P4, P5 and P6 are disposed on an upper surface of the second layer 224. The upper surface of the second layer 224 faces toward the first layer 222. A lower surface of the first layer 222 is in contact with the upper surface of the second layer 224.

The first signal transmitting line group ST1, ST2, ST3 and ST4 is connected to source pads P1, P2, P4 and P5 of the pad part P1, P2, P3, P4, P5 and P6 disposed on the upper surface of the second layer 224 through pad contact holes HP1, HP2, HP3 and HP4 of the first layer 222.

The second signal transmitting line group GT1 and GT2 is directly connected to gate pads P3 and P6 of the pad part P1, P2, P3, P4, P5 and P6 on the second layer 224.

In the present exemplary embodiment, the source driving chip SIC is connected to a first signal transmitting pattern disposed on the upper surface of the first layer 222. The first signal transmitting pattern is a conductive pattern which overlaps the source driving chip SIC. The first signal transmitting pattern is directly connected to signal transmitting lines ST1, ST2, ST3 and ST4 of the first signal transmitting line group.

The gate driving chip GIC is in contact with a second signal transmitting pattern disposed on the upper surface of the second layer 224 through a chip contact hole HC. The second signal transmitting pattern is a conductive pattern which overlaps the gate driving chip GIC. The second signal transmitting pattern is directly connected to signal transmitting lines GT1 and GT2 of the second signal transmitting line group.

Figure 5:
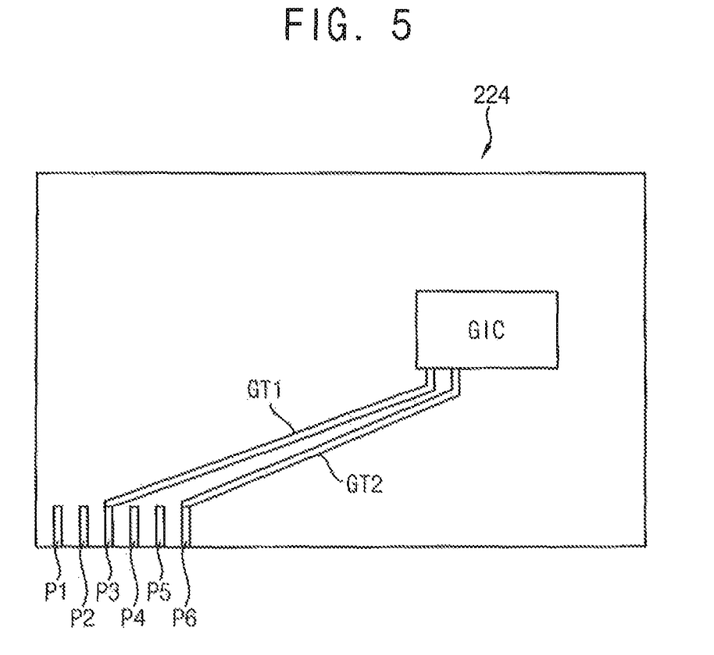
FIG. 5 is a plan view illustrating a second layer of FIG. 3.

FIG. 5 is a plan view illustrating only the second layer 224 of the flexible printed circuit board 220 of FIG. 3. In FIG. 5, the first layer 222 of the flexible printed circuit board 220 is omitted for the convenience of description. In FIG. 5, the gate driving chip GIC is in contact with the first layer 222, not to the second layer 222.

Two first signal transmitting lines and one second signal transmitting line are alternately connected to the pads of the pad part. For example, the second signal transmitting line GT1 is connected to the pad P3 which is interposed between first two pads P1 and P2, and second two pads P4 and P5. The first two pads P1 and P2 are connected to two first signal transmitting lines ST1 and ST2. The second two pads P4 and 5 are connected to two first signal transmitting lines ST3 and ST4. In such connections, the two first signal transmitting lines ST3 and ST4 cross the second signal transmitting line GT1, when viewed from the above.

The gate driving chip GIC and the source driving chip SIC are disposed on the upper surface of the first layer 222. A bump part of the source driving chip SIC are disposed on the first layer 222 to be in contact with the first signal transmitting pattern on the upper surface of the first layer 222.

A bump part of the gate driving chip SIC is disposed on the first layer 222. The bump part of the gate driving chip SIC is in contact with the second signal transmitting pattern protruded from the upper surface of the second surface 224 toward the chip contact hole HC. Alternatively, the bump part of the gate driving chip GIC may pass through the chip contact hole HC to be in contact with the second signal transmitting pattern. Although the bump part of the gate driving chip GIC passes through the chip contact hole HC, the main body of the gate driving chip GIC is disposed on the upper surface of the first layer 222 so that the gate driving chip GIC is regarded as to be disposed on the upper surface of the first layer 222.

In the present exemplary embodiment, the source driving chip SIC and the gate driving chip GIC are disposed adjacent to each other in a horizontal direction in the flexible printed circuit board 220.

In the present exemplary embodiment, a width W1 of the first layer 222 in the vertical direction is less than a width W2 of the second layer 224 in the vertical direction so that the pad part P1, P2, P3, P4, P5 and P6 disposed on the upper surface of the second layer 224 is not covered with the first layer 22. Accordingly, the pad part P1 to P6 is exposed.

The exposed pad part P1, P2, P3, P4, P5 and P6 is bonded to the display panel 100 so that the exposed pad part P1, P2, P3, P4, P5 and P6 is in contact with an upper surface of the display panel 100. The source pads P1, P2, P4 and P5 are connected to the data lines DL of the display panel 100. Gate pads P3 and P6 of the pad part are connected to the gate lines GLA, GLB1 of the display panel 100.

According to an exemplary embodiment, the source driving chip SIC and the gate driving chip GIC are disposed on the first layer 222. However, the present inventive concept is not limited thereto. For example, the source driving chip SIC and the gate driving chip SIC may be disposed on the second layer 224, or the source driving chip SIC and the gate driving chip GIC may be disposed on different layers.

Although the source driving chip SIC is disposed at a left side and the gate driving chip GIC is disposed at a right side in the flexible printed circuit hoard 220 in the present exemplary embodiment, the present exemplary embodiment is not limited thereto. For example, the source driving chip SIC may be disposed at a right side and the gate driving chip GIC may be disposed at a left side in the flexible printed circuit board 220.

According to the present exemplary embodiment, the gate driving chip GIC and the source driving chip SIC are disposed adjacent to the upper portion of the display panel 100 so that the width of the bezel at the side portion of the display panel 100 may decrease.

In addition, the gate driving chip GIC and the source driving chip SIC are formed in a single package so that a manufacturing process may be simplified compared to independently manufacturing the gate driving chip GIC and the source driving chip SIC and bonding to each other.

In addition, the gate driving chip GIC and the source driving chip SIC are formed in a single package so that the number of the packages is reduced. Therefore, the manufacturing cost may be reduced.

Figure 6:
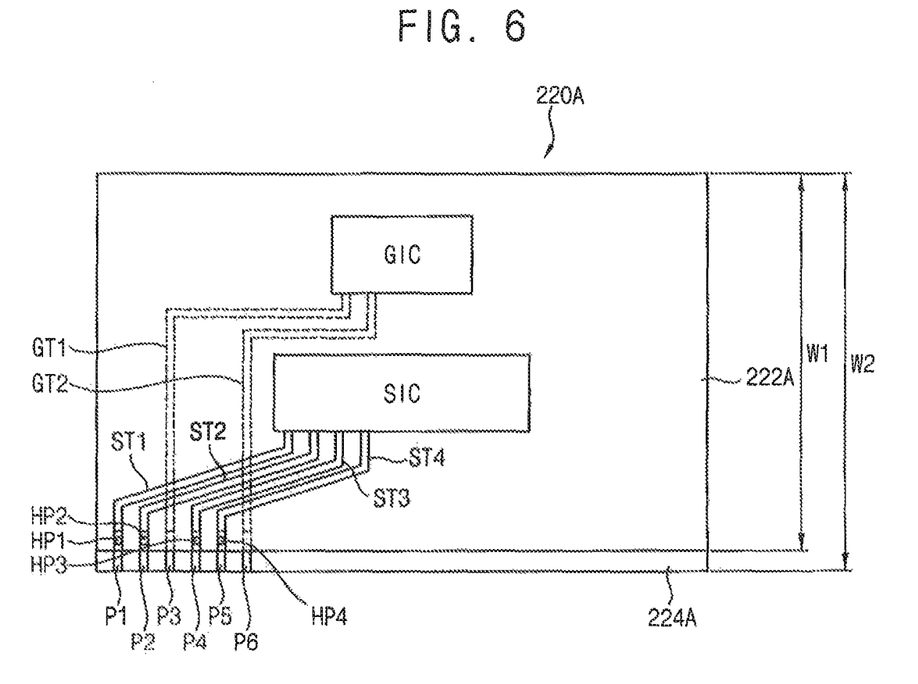
FIG. 6 is a plan view illustrating a flexible printed circuit board of a display apparatus according to an exemplary embodiment of the present inventive concept.
Figure 7:
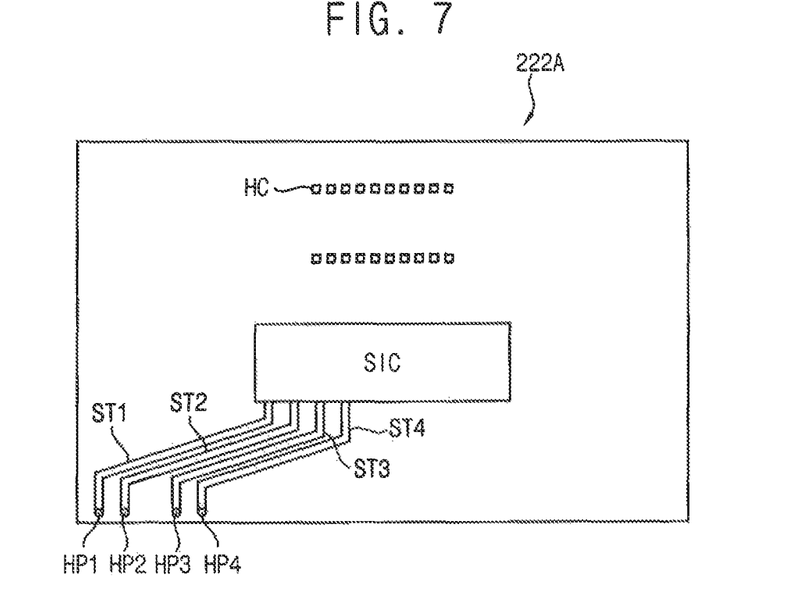
FIG. 7 is a plan view illustrating a first layer of FIG. 6.
Figure 8:
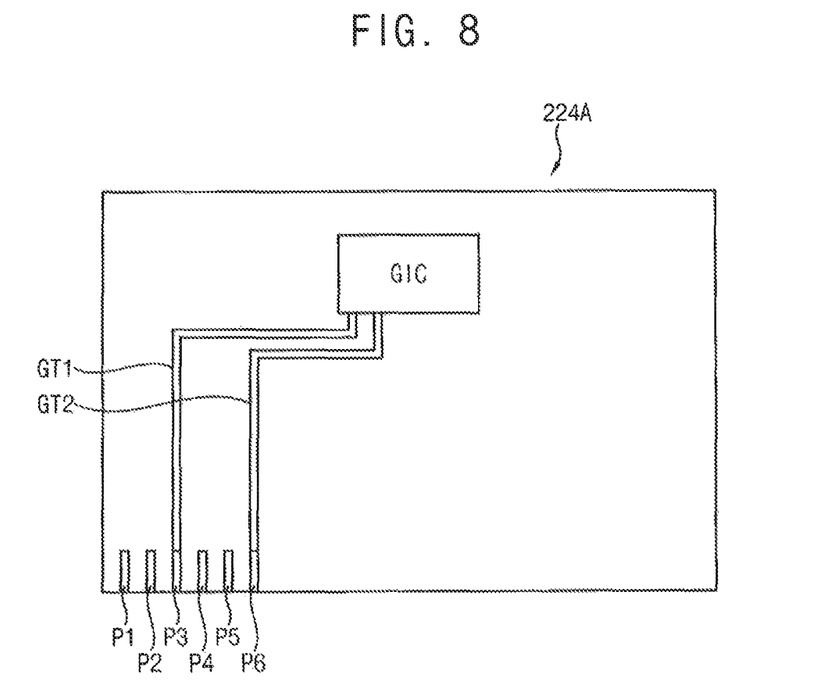
FIG. 8 is a plan view illustrating a second layer of FIG. 6.

FIG. 6 is a plan view illustrating a flexible printed circuit board 220A of a display apparatus according to an exemplary embodiment of the present inventive concept. FIG. 7 is a plan view illustrating a first layer 222A of FIG. 6. FIG. 8 is a plan view illustrating a second layer 224A of FIG. 6.

The display apparatus according to the present exemplary embodiment is substantially the same as the display apparatus of the previous exemplary embodiment described referring to FIGS. 1 to 5 except for the structure of the flexible printed circuit board. Thus, the same reference numerals will be used to refer to the same or like parts as those described in the previous exemplary embodiment of FIGS. 1 to 5, and for the convenience of description, the description thereof will be omitted.

Referring to FIGS. 1, 2, 6 to 8, the display apparatus includes a display panel 100 and a panel driver. The panel driver includes a printed circuit board ("PCB") 210 and a plurality of flexible printed circuit board ("FPC") 220A.

The display panel 100 displays an image. The display panel 100 includes a plurality of gate lines, a plurality of data lines and a plurality of pixels connected to the gate lines and the data lines.

A first side of the flexible printed circuit board 220A is connected to the display panel 100. A second side of the flexible printed circuit board 220A is connected to the printed circuit board 210.

For example, the flexible printed circuit board 220A is disposed on an upper side of the display panel 100.

The flexible printed circuit board 220A includes both of a gate driving chip and a source driving chip. Thus, the gate driving chip and the source driving chip are disposed in a same direction with respect to the display panel 100.

The flexible printed circuit board 220A includes the first layer 222A and the second layer 224A. A first signal transmitting line group ST1, ST2, ST3 and ST4 are disposed on the first layer 222A. A second signal transmitting line group GT1 and GT2 and a pad part P1, P2, P3, P4, P5 and P6 are disposed on the second layer 224A. The pad part P1 to P6 is connected to the display panel 100.

The first signal transmitting line group ST1, ST2, ST3 and ST4 is disposed on an upper surface of the first layer 222A. The upper surface of the first layer 222A faces toward the printed circuit board 210. The second signal transmitting line group GT1 and GT2 and the pad part P1, P2, P3, P4, P5 and P6 are disposed on an upper surface of the second layer 224A. The upper surface of the second layer 224A faces toward the first layer 222A. A lower surface of the first layer 222A is in contact with the upper surface of the second layer 224A.

The first signal transmitting line group ST1, ST2, ST3 and ST4 is connected to source pads P1, P2, P4 and P5 of the pad part P1, P2, P3, P4, P5 and P6 disposed on the upper surface of the second layer 224A through pad contact holes HP1, HP2, HP3 and HP4 of the first layer 222A.

The second signal transmitting line group GT1 and GT2 is directly connected to gate pads P3 and P6 of the pad part P1, P2, P3, P4, P5 and P6 on the second layer 224A.

In the present exemplary embodiment, the source driving chip SIC is in contact with) a first signal transmitting pattern disposed on the upper surface of the first layer 222A. The first signal transmitting pattern is a conductive pattern which overlaps the source driving chip SIC. The first signal transmitting pattern is directly connected to signal transmitting lines ST1, ST2, ST3 and ST4 of the first signal transmitting line group.

The gate driving chip GIC is in contact with a second signal transmitting pattern disposed on the upper surface of the second layer 224A through a chip contact hole HC. The second signal transmitting pattern is a conductive pattern which overlaps the gate driving chip GIC. The second signal transmitting pattern is directly connected to signal transmitting lines GT1 and GT2 of the second signal transmitting line group.

FIG. 8 is a plan view illustrating only the second layer 224A of the flexible printed circuit board 220A of FIG. 7. In FIG. 8, the first layer 222A of the flexible printed circuit board 220A is omitted for the convenience of description. In FIG. 8, the gate driving chip GIC is attached to the first layer 222A, not to the second layer 224A.

In the present exemplary embodiment, the source driving chip SIC and the gate driving chip GIC are disposed adjacent to each other in a vertical direction in the flexible printed circuit board 220A.

In the present exemplary embodiment, a width W1 of the first layer 222A in the vertical direction is less than a width W2 of the second layer 224A in the vertical direction so that the pad part P1, P2, P3, P4, P5 and P6 disposed on the upper surface of the second layer 224A is not covered with the first layer 222A. Accordingly, the pad part P1 to P6 is exposed.

The exposed pad part P1, P2, P3, P4, P5 and P6 is bonded to the display panel 100 so that the exposed pad part P1, P2, P3, P4, P5 and P6 is in contact with an upper surface of the display panel 100. The source pads P1, P2, P4, and P5 are connected to the data lines DL of the display panel 100. Gate pads P3 and P6 of the pad part are connected to the gate lines GLA, GLB1 of the display panel 100.

According to an exemplary embodiment, the source driving chip SIC and the gate driving chip GIC are disposed on the first layer 222A. However, the present inventive concept is not limited thereto. For example, the source driving chip SIC and the gate driving chip GIC may be disposed on the second layer 224A, or the source driving chip SIC and the gate driving chip GIC may be disposed on different layers.

The source driving chip SIC is disposed in a lower portion and the gate driving chip GIC is disposed in an upper portion in the flexible printed circuit board 220A. The second signal transmitting line group GT1 and GT2 detours the area of the source driving chip SIC to be connected to gate pads P3 and P6.

The present inventive concept is not limited thereto. For example, the source driving chip SIC may be disposed in the upper portion and the gate driving chip GIC may be disposed in the lower portion in the flexible printed circuit board 220A. In this case, some signal transmitting lines of the first signal transmitting line group may detour the area of the gate driving chip GIC to be connected to source pads P1, P2, P4 and P5.

According to the present exemplary embodiment, the gate driving chip GIC and the source driving chip SIC are disposed adjacent to the upper portion of the display panel 100 so that the width of the bezel at the side portion of the display panel 100 may decrease.

In addition, the gate driving chip GIC and the source driving chip SIC are formed in a single package so that a manufacturing process may be simplified compared to independently manufacturing the gate driving chip GIC and the source driving chip SIC and bonding to each other.

In addition, the gate driving chip GIC and the source driving chip SIC are formed in a single package so that the number of the packages is reduced. Therefore, the manufacturing cost may be reduced.

Figure 9:
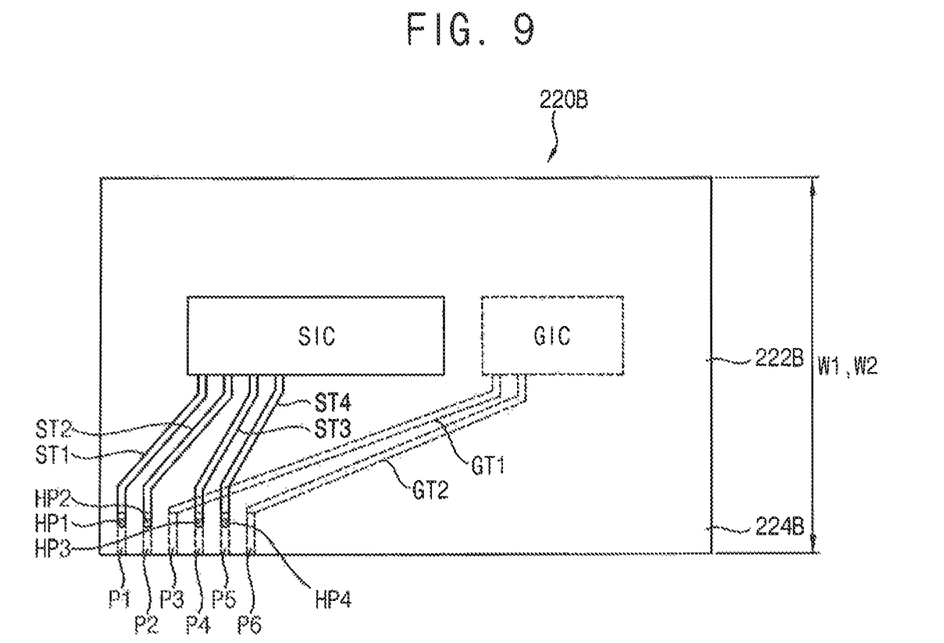
FIG. 9 is a plan view illustrating a flexible printed circuit board of a display apparatus according to an exemplary embodiment of the present inventive concept.
Figure 10:
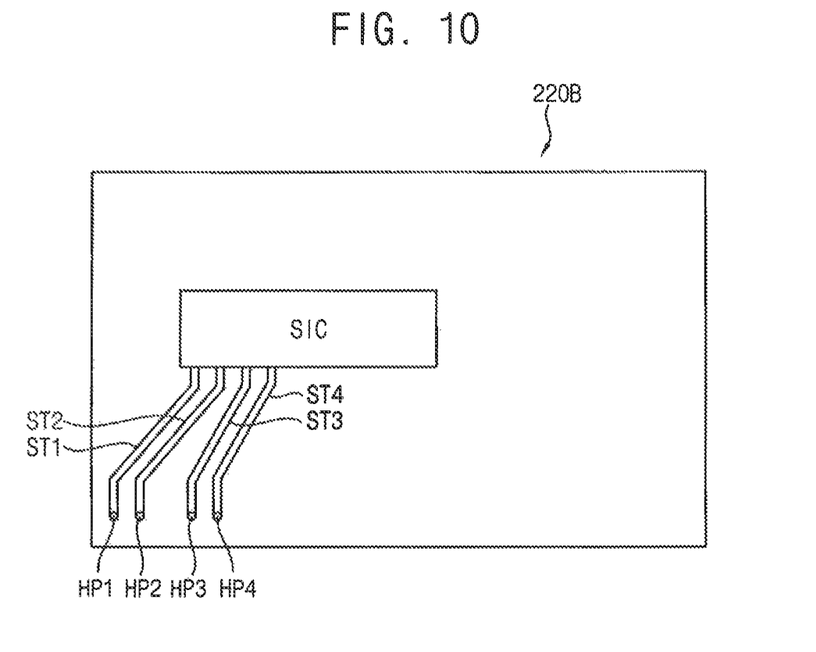
FIG. 10 is a plan view illustrating a first layer of FIG. 9.
Figure 11:
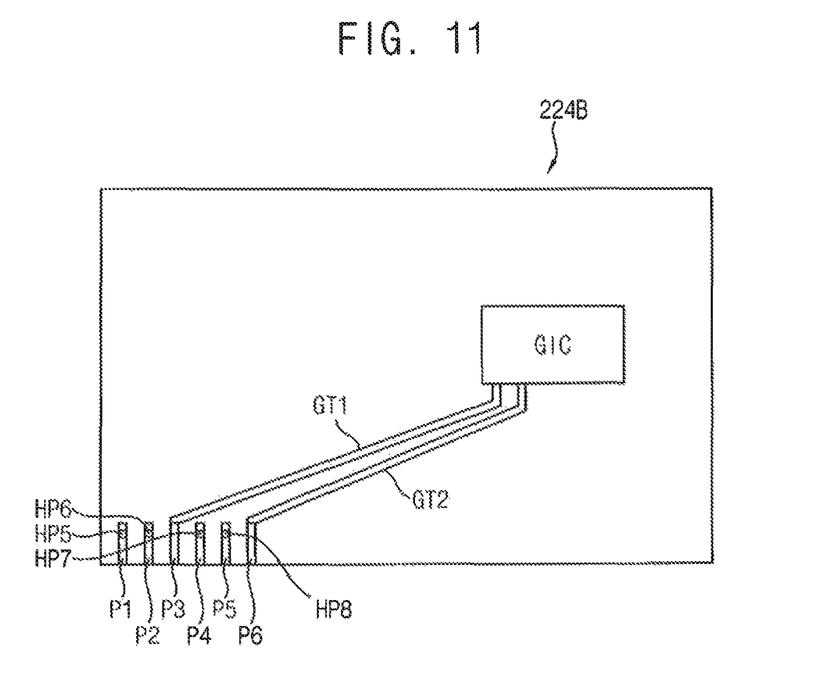
FIG. 11 is a plan view illustrating a second layer of FIG. 9.

FIG. 9 is a plan view illustrating a flexible printed circuit board 220B of a display apparatus according to an exemplary embodiment of the present inventive concept. FIG. 10 is a plan view illustrating a first layer 222B of FIG. 9. FIG. 11 is a plan view illustrating a second layer 224B of FIG. 9.

The display apparatus according to the present exemplary embodiment is substantially the same as the display apparatus of the previous exemplary embodiment described referring to FIGS. 1 to 5 except for the structure of the flexible printed circuit board. Thus, the same reference numerals will be used to refer to the same or like parts as those described in the previous exemplary embodiment of FIGS. 1 to 5, and for the convenience of description, the description thereof will be omitted.

Referring to FIGS. 1, 2, 9 to 11, the display apparatus includes a display panel 100 and a panel driver. The panel driver includes a printed circuit board ("PCB") 210 and a plurality of flexible printed circuit board ("FPC") 220B.

The display panel 100 displays an image. The display panel 100 includes a plurality of gate lines, a plurality of data lines and a plurality of pixels connected to the gate lines and the data lines.

A first side of the flexible printed circuit board 220B is connected to the display panel 100. A second side of the flexible printed circuit board 220B is connected to the printed circuit board 210.

For example, the flexible printed circuit board 220B is disposed on an upper side of the display panel 100.

The flexible printed circuit board 220B includes both of a gate driving chip and a source driving chip. Thus, the gate driving chip and the source driving chip are disposed in a same direction with respect to the display panel 100.

The flexible printed circuit board 220B includes the first layer 222B and the second layer 224B. A first signal transmitting line group ST1, ST2, ST3 and ST4 are disposed on the first layer 222B. A second signal transmitting line group GT1 and GT2 and a pad part P1, P2, P3, P4, P5 and P6 are disposed on the second layer 224B. The pad part P1 to P6 is connected to the display panel 100.

The first signal transmitting line group ST1, ST2, ST3 and ST4 is disposed on an upper surface of the first layer 222B. The upper surface of the first layer 222B faces toward the printed circuit board 210. The second signal transmitting line group GT1 and GT2 and the pad part P1, P2, P3, P4, P5 and P6 are disposed on a lower surface of the second layer 224B. The upper surface of the second layer 224B faces toward the first layer 222B. A lower surface of the first layer 222B is in contact with the upper surface of the second layer 224B.

The first signal transmitting line group ST1, ST2, ST3 and ST4 is connected to source pads P1, P2, P4 and P5 of the pad part P1, P2, P3, P4, P5 and P6 disposed on the lower surface of the second layer 224B through first pad contact holes HP1, HP2, HP3 and HP4 of the first layer 222B and second pad contact holes HP5, HP6, HP7 and HP8 of the second layer 224B. The second pad contact holes HP5, HP6, HP7 and HP8 are formed from the upper surface of the second layer 224B toward the pad part P1, P2, P3, P4, P5 and P6 disposed on the lower surface of the second layer 224B.

The second signal transmitting line group GT1 and GT2 is directly connected to gate pads P3 and P6 of the pad part P1, P2, P3, P4, P5 and P6 disposed on the second layer 224B.

In the present exemplary embodiment, the source driving chip SIC is in contact with a first signal transmitting pattern disposed on the upper surface of the first layer 222B. The first signal transmitting pattern is a conductive pattern which overlaps the source driving chip SIC. The first signal transmitting pattern is directly connected to signal transmitting lines ST1, ST2, ST3 and ST4 of the first signal transmitting line group.

The gate driving chip GIC directly is in contact with a second signal transmitting pattern disposed on the lower surface of the second layer 224B. The second signal transmitting pattern is a conductive pattern which overlaps the gate driving chip GIC. The second signal transmitting pattern is directly connected to signal transmitting lines GT1 and GT2 of the second signal transmitting line group.

In the present exemplary embodiment, the source driving chip SIC and the gate driving chip GIC are disposed adjacent to each other in a horizontal direction in the flexible printed circuit board 220B.

In the present exemplary embodiment, a width W1 of the first layer 222B in the vertical direction may be substantially the same as a width W2 of the second layer 224B in the vertical direction. The pad part P1, P2, P3, P4, P5 and P6 is disposed on the lower surface of the second layer 224B to be exposed.

The exposed pad part P1, P2, P3, P4, P5 and P6 is bonded to the display panel 100 so that the exposed pad part P1, P2, P3, P4, P5 and P6 is in contact with an upper surface of the display panel 100. The source pads P1, P2, P4 and P5 are connected to the data lines DL of the display panel 100. The gate pads P3 and P6 are connected to the gate lines GLA, GLB1 of the display panel 100.

According to an exemplary embodiment, the source driving chip SIC is disposed on the first layer 222B and the gate driving chip GIC is disposed on the second layer 224B, The present inventive concept is not limited thereto. Alternatively, the source driving chip SIC may be disposed on the second layer 224B and the gate driving chip GIC may be disposed on the first layer 222B.

According to the present exemplary embodiment, the gate driving chip GIC and the source driving chip SIC are disposed adjacent to the upper portion of the display panel 100 so that the width of the bezel at the side portion of the display panel 100 may decrease.

In addition, the gate driving chip GIC and the source driving chip SIC are formed in a single package so that a manufacturing process may be simplified compared to independently manufacturing the gate driving chip GIC and the source driving chip SIC and bonding to each other.

In addition, the gate driving chip GIC and the source driving chip SIC are formed in a single package so that the number of the packages is reduced. Therefore, the manufacturing cost may be reduced.

In addition, one of the gate driving chip GIC and the source driving chip SIC is disposed on an upper surface of the flexible printed circuit board 220B and the other of the gate driving chip GIC and the source driving chip SIC is disposed on a lower surface of the flexible printed circuit board 220B so that pressure is not concentrated to a single surface of the flexible printed circuit board 220B.

Figure 12:
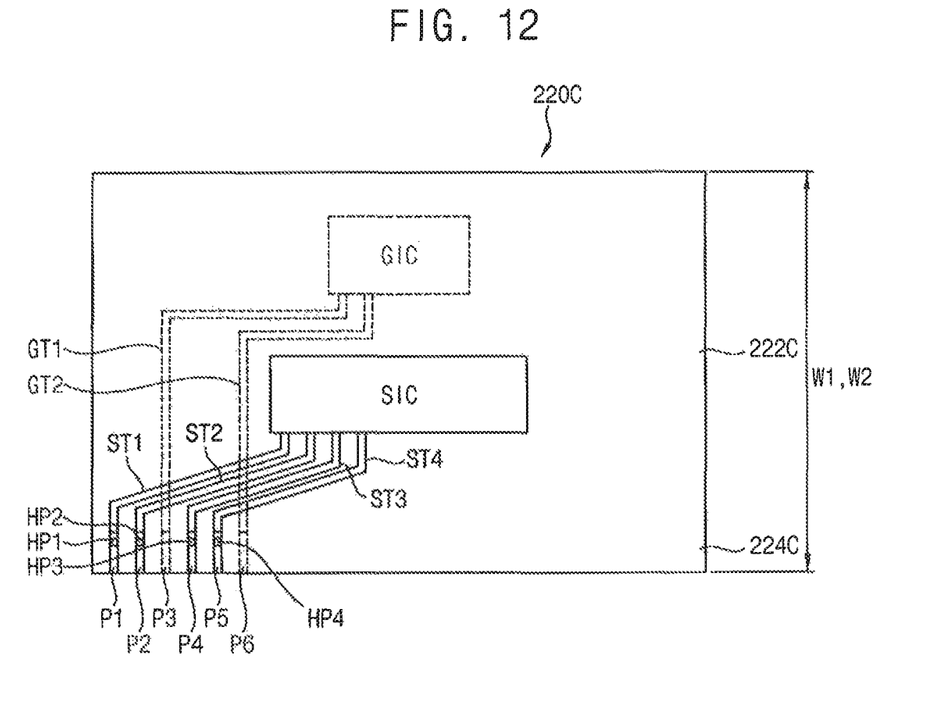
FIG. 12 is a plan view illustrating a flexible printed circuit board of a display apparatus according to an exemplary embodiment of the present inventive concept.
Figure 13:
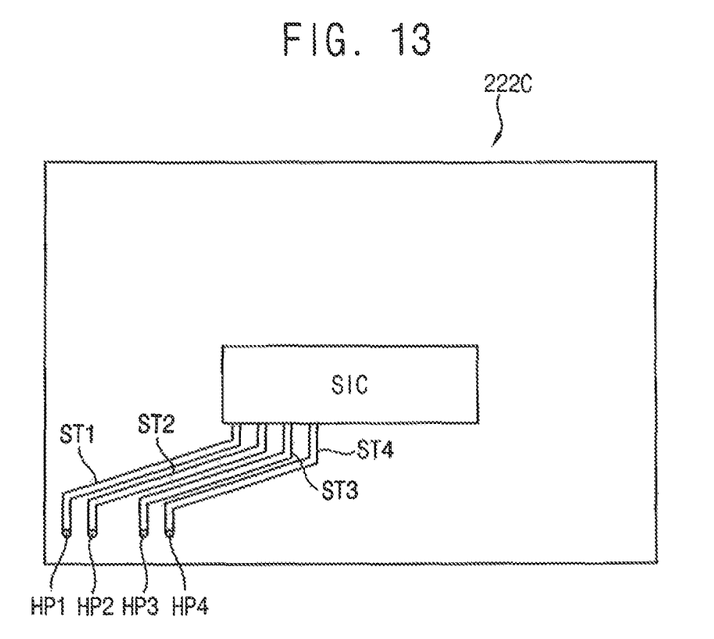
FIG. 13 is a plan view illustrating a first layer of FIG. 12.
Figure 14:
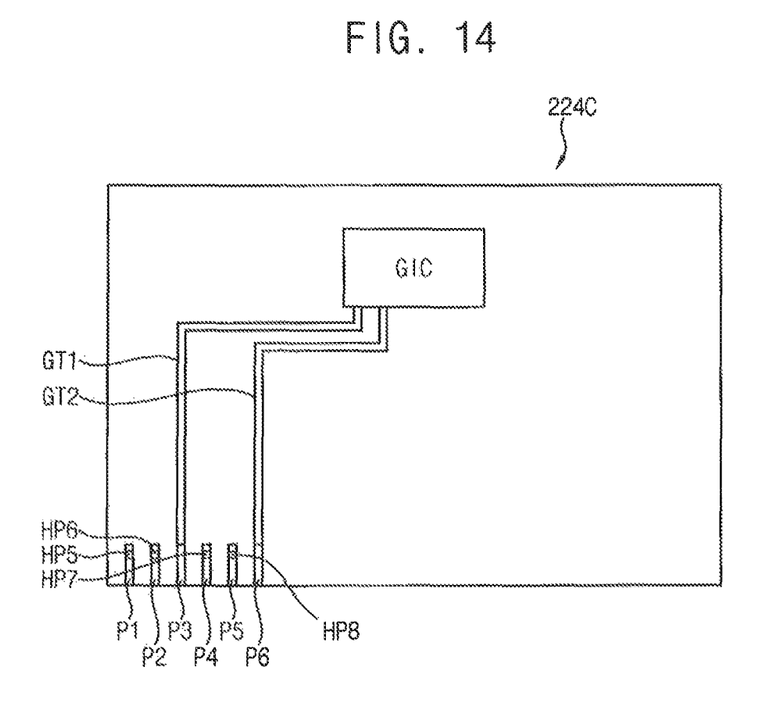
FIG. 14 is a plan view illustrating a second layer of FIG. 12.

FIG. 12 is a plan view illustrating a flexible printed circuit board 220C of a display apparatus according to an exemplary embodiment of the present inventive concept. FIG. 13 is a plan view illustrating a first layer 222C of FIG. 12. FIG. 14 is a plan view illustrating a second layer 224C of FIG. 12.

The display apparatus according to the present exemplary embodiment is substantially the same as the display apparatus of the previous exemplary embodiment described referring to FIGS. 1 to 5 except for the structure of the flexible printed circuit board. Thus, the same reference numerals will be used to refer to the same or like parts as those described in the previous exemplary embodiment of FIGS. 1 to 5, and for the convenience of description, the description thereof will be omitted.

Referring to FIGS. 1, 2, 12 to 14, the display apparatus includes a display panel 100 and a panel driver. The panel driver includes a printed circuit board ("PCB") 210 and a plurality of flexible printed circuit board ("FPC") 220C.

The display panel 100 displays an image. The display panel 100 includes a plurality of gate lines, a plurality of data lines and a plurality of pixels connected to the gate lines and the data lines.

A first side of the flexible printed circuit board 220C is connected to the display panel 100. A second side of the flexible printed circuit hoard 220C is connected to the printed circuit board 210.

For example, the flexible printed circuit board 220C is disposed on an upper side of the display panel 100.

The flexible printed circuit board 220C includes both of a gate driving chip and a source driving chip. Thus, the gate driving chip and the source driving chip are disposed in a same direction with respect to the display panel 100.

The flexible printed circuit board 220C includes the first layer 222C and the second layer 224C. A first signal transmitting line group ST1, ST2, ST3 and ST4 are disposed on the first layer 222C. A second signal transmitting line group GT1 and GT2 and a pad part P1, P2, P3, P4, P5 and P6 connected to the display panel 100 are disposed on the second layer 224C.

The first signal transmitting line group ST1, ST2, ST3 and ST4 is disposed on an upper surface of the first layer 222C. The second signal transmitting line group GT1 and GT2 and the pad part P1, P2, P3, P4, P5 and P6 are disposed on a lower surface of the second layer 224C. A lower surface of the first layer 222C is in contact with the upper surface of the second layer 224C.

The first signal transmitting line group ST1, ST2, ST3 and ST4 is connected to source pads P1, P2, P4 and P5 of the pad part P1, P2, P3, P4, P5 and P6 disposed on the lower surface of the second layer 224C through first pad contact holes HP1, HP2, HP3 and HP4 of the first layer 222C and second pad contact holes HP5, HP6, HP7 and HP8 of the second layer 224C. The second pad contact holes HP5, HP6, HP7 and HP8 are formed from the upper surface of the second layer 224C toward the pad part P1, P2, P3, P4, P5 and P6 disposed on the lower surface of the second layer 224C.

The second signal transmitting line group GT1 and GT2 is connected to gate pads P3 and P6 of the pad part P1, P2, P3, P4, P5 and P6 on the second layer 224C.

In the present exemplary embodiment, the source driving chip SIC is connected to a first signal transmitting pattern disposed on the upper surface of the first layer 222C. The first signal transmitting pattern is a conductive pattern which overlaps the source driving chip SIC. The first signal transmitting pattern is directly connected to signal transmitting lines ST1, ST2, ST3 and ST4 of the first signal transmitting line group.

The gate driving chip GIC is connected to a second signal transmitting pattern disposed on the lower surface of the second layer 224C. The second signal transmitting pattern is a conductive pattern which overlaps the gate driving chip GIC. The second signal transmitting pattern is directly connected to signal transmitting lines GT1 and GT2 of the second signal transmitting line group.

In the present exemplary embodiment, the source driving chip SIC and the gate driving chip GIC are disposed adjacent to each other in a vertical direction in the flexible printed circuit board 220C.

In the present exemplary embodiment, a width W1 of the first layer 222C in the vertical direction may be substantially the same as a width W2 of the second layer 224C in the vertical direction. The pad part P1, P2, P3, P4, P5 and P6 is disposed on the lower surface of the second layer 224C to be exposed.

The exposed pad part P1, P2, P3, P4, P5 and P6 is bonded to the display panel 100 so that the exposed pad part P1, P2, P3, P4, P5 and P6 is connected to an upper surface of the display panel 100. The source pads P1, P2, P4 and P5 of the pad part are connected to the data lines DL of the display panel 100. The gate pads P3 and P6 of the pad part are connected to the gate lines GLA, GLB1 of the display panel 100.

The source driving chip SIC is disposed on the first layer 222C and the gate driving chip GIC is disposed on the second layer 224C. The present inventive concept is not limited thereto.

For example, the source driving chip SIC may be disposed on the second layer 224C and the gate driving chip GIC may be disposed on the first layer 222C.

According to the present exemplary embodiment, the gate driving chip GIC and the source driving chip SIC are disposed adjacent to the upper portion of the display panel 100 so that the width of the bezel at the side portion of the display panel 100 may decrease.

In addition, the gate driving chip GIC and the source driving chip SIC are formed in a single package so that a manufacturing process may be simplified compared to independently manufacturing the gate driving chip GIC and the source driving chip SIC and bonding to each other.

In addition, the gate driving chip GIC and the source driving Chip SIC are formed in a single package so that the number of the packages is reduced. Therefore, the manufacturing cost may be reduced.

In addition, one of the gate driving chip GIC and the source driving chip SIC is disposed on an upper surface of the flexible printed circuit board 220C and the other of the gate driving chip GIC and the source driving chip SIC is disposed on a lower surface of the flexible printed circuit board 220C so that pressure is not concentrated to a single surface of the flexible printed circuit board 220C.

Figure 15:
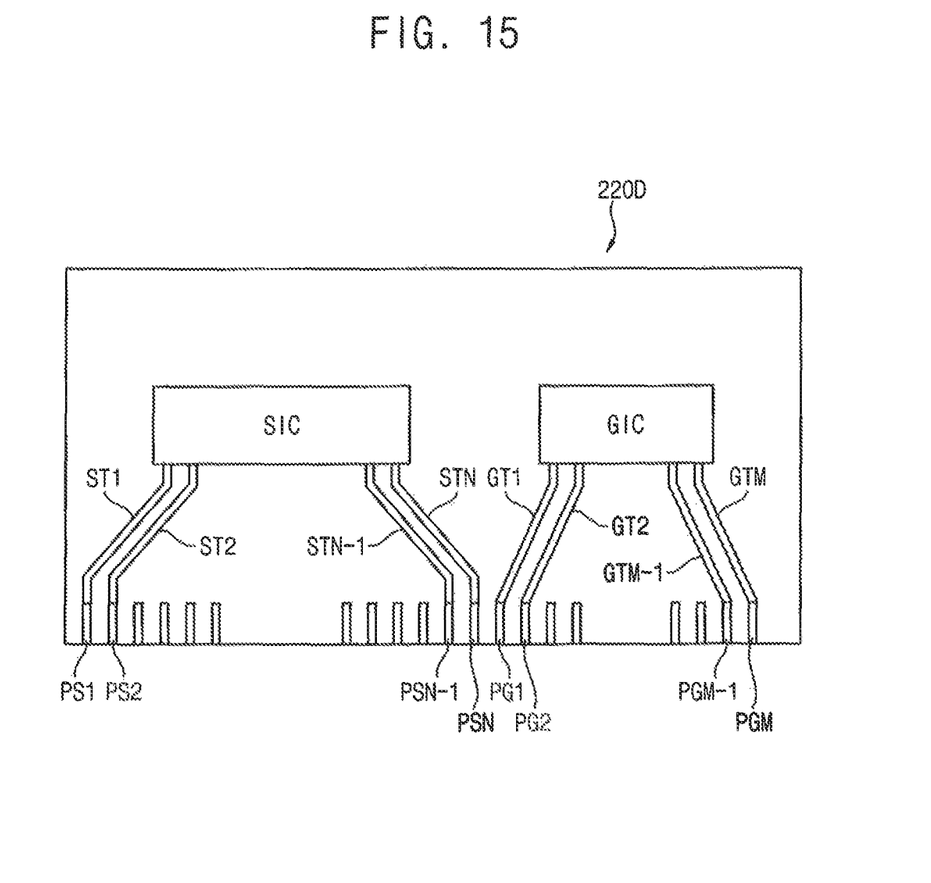
FIG. 15 is a plan view illustrating a flexible printed circuit board of a display apparatus according to an exemplary embodiment of the present inventive concept.

FIG. 15 is a plan view illustrating a flexible printed circuit board 220D of a display apparatus according to an exemplary embodiment of the present inventive concept.

The display apparatus according to the present exemplary embodiment is substantially the same as the display apparatus of the previous exemplary embodiment described referring to FIGS. 1 to 5 except for the structure of the flexible printed circuit board. Thus, the same reference numerals will be used to refer to the same or like parts as those described in the previous exemplary embodiment of FIGS. 1 to 5, and for the convenience of description, the description thereof will be omitted.

Referring to FIGS. 1, 2 and 15, the display apparatus includes a display panel 100 and a panel driver. The panel driver includes a printed circuit board ("PCB") 210 and a plurality of flexible printed circuit board ("FPC") 220D.

The display panel 100 displays an image. The display panel 100 includes a plurality of gate lines, a plurality of data lines and a plurality of pixels connected to the gate lines and the data lines.

A first side of the flexible printed circuit board 220B is connected to the display panel 100. A second side of the flexible printed circuit board 220B is connected to the printed circuit board 210.

For example, the flexible printed circuit board 220B is disposed on the display panel 100. For example, the flexible printed circuit board 220D may be disposed on an upper side of the display panel 100.

The flexible printed circuit board 220D includes a gate driving chip and a source driving chip. Thus, the gate driving chip and the source driving chip are disposed in a same direction with respect to the display panel 100.

In the present exemplary embodiment, the flexible printed circuit board 220D has a single layer structure. The flexible printed circuit board 220D includes a base substrate on which a first signal transmitting line group ST1, ST2, . . . , STN−1 and STN, a second signal transmitting line group GT1, GT2, . . . , GTM−1 and GTM and a pad part PS1, PS2, . . . , PSN−1, PSN, PG1, PG2, . . . , and PGM−1 connected to the display panel 100 are disposed.

The first signal transmitting line group ST1, ST2, . . . , STN−1 and STN, the second signal transmitting line group GT1, GT2, . . . , GTM−1 and GTM and the pad part PS1, PS2, . . . , PSN−1, PSN, PG1, PG2, . . . , PGM−1, PGM are disposed on an upper surface of the base substrate.

The first signal transmitting line group ST1, ST2, . . . , STN−1 and STN is connected to source pads PS1, PS2, . . . , PSN−1 and PSN of the pad part disposed on the base substrate.

The second signal transmitting line group GT1, GT2, . . . , GTM−1 and GTM is connected to gate pads PG1, PG2, . . . , PGM−1 and PGM of the pad part disposed on the base substrate.

In the present exemplary embodiment, the source driving chip SIC is in contact with a first signal transmitting pattern disposed on the upper surface of the base substrate. The first signal transmitting pattern is a conductive pattern which overlaps the source driving chip SIC.

The first signal transmitting pattern is connected to signal transmitting lines ST1, ST2, . . . , STN−1 and STN of the first signal transmitting line group.

The gate driving chip GIC is in contact with a second signal transmitting pattern disposed on the upper surface of the base substrate. The second signal transmitting pattern is a conductive pattern which overlaps the gate driving chip GIC. The second signal transmitting pattern is connected to signal transmitting lines GT1, GT2, . . . , GTM−1 and GTM of the second signal transmitting line group.

In the present exemplary embodiment, the source driving chip SIC and the gate driving chip GIC are disposed adjacent to each other in a horizontal direction in the flexible printed circuit board 220D.

The exposed pad part PS1, PS2, . . . , PSN−1, PSN, PG1, PG2, . . . , PGM−1 and PGM is bonded to the display panel 100 so that the exposed pad part PSI, PS2, . . . , PSN−1, PSN, PG1, PG2, . . . , PGM−1 and PGM is in contact with an upper surface of the display panel 100. Source pads PS1, PS2, . . . , PSN−1 and PSN of the pad part are connected to the data lines DL of the display panel 100. Gate pads PG1, PG2, . . . , PGM−1 and PGM of the pad part are connected to the gate lines GLA, GLB1 of the display panel 100.

The signal transmitting lines ST1, ST2, . . . , STN−1 and STN of the first signal transmitting line group do not cross the signal transmitting lines GT1, GT2, . . . , GTM-1 and GTM of the second signal transmitting line group.

According to the present exemplary embodiment, the gate driving chip GIC and the source driving chip SIC are disposed adjacent to the upper portion of the display panel 100 so that the width of the bezel at the side portion of the display panel 100 may decrease.

In addition, the gate driving chip GIC and the source driving chip SIC are formed in a single package so that a manufacturing process may he simplified compared to independently manufacturing the gate driving chip GIC and the source driving chip SIC and bonding to each other.

In addition, the gate driving chip GIC and the source driving chip SIC are formed in a single package so that the number of the packages is reduced. Therefore, the manufacturing cost may be reduced.

According to the present exemplary embodiment, a width of the bezel of the display apparatus may decrease, a process of manufacturing the display apparatus may be simplified and a manufacturing cost of the display apparatus may be reduced.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A display apparatus comprising:
a display panel comprising a gate line and a data line; and
a plurality of flexible printed circuit boards connected to one side of the display panel,
wherein each of the plurality of flexible printed circuit boards comprises a gate driving chip configured to apply a gate signal to the gate line and a source driving chip configured to apply a data voltage to the data line,
wherein each of the plurality of flexible printed circuit boards comprises:
a first layer on which a first signal transmitting line group connected to the source driving chip to transmit the data voltage to the data line is disposed; and
a second layer on which a second signal transmitting line group connected to the gate driving chip to transmit the gate signal to the gate line is disposed,
wherein the first layer and the second layer are different from each other, and
wherein the first signal transmitting line group transmitting the data voltage and the second signal transmitting line group transmitting the gate signal overlapped and cross each other.

2. The display apparatus of claim 1, further comprising a printed circuit board configured to apply a gate control signal to the gate driving chip and a data control signal to the source driving chip,
wherein the printed circuit board is connected to the plurality of flexible printed circuit boards, and wherein the plurality of flexible printed circuit boards is disposed between the printed circuit board and the display panel.

3. The display apparatus of claim 1,
wherein each of the plurality of flexible printed circuit boards further comprises:
a pad part disposed on the second layer, and
wherein the source driving chip is connected to a first group of the pad part through the first signal transmitting line group, and the gate driving chip is connected to a second group of the pad part through the second signal transmitting line group.

4. The display apparatus of claim 3,
wherein the first signal transmitting line group is disposed on an upper surface of the first layer,
wherein the second signal transmitting line group and the pad part are disposed on an upper surface of the second layer, and
wherein a lower surface of the first layer is in contact with the upper surface of the second layer.

5. The display apparatus of claim 4,
wherein the first signal transmitting line group is connected to the pad part on the upper surface of the second layer through a pad contact hole formed in the first layer.

6. The display apparatus of claim 4,
wherein the source driving chip is in contact with a first signal transmitting pattern disposed on the upper surface of the first layer, and
wherein the gate driving chip is in contact with a second signal transmitting pattern on the upper surf tee of the second layer through a chip contact hole.

7. The display apparatus of claim 6,
wherein the gate driving chip and the source driving chip are disposed on the upper surface of the first layer.

8. The display apparatus of claim 4,
wherein a width of the first layer is less than a width of the second layer such that the pad part on the upper surface of the second layer is exposed.

9. The display apparatus of claim 3,
wherein the first signal transmitting line group is disposed on an upper surface of the first layer,
wherein the second signal transmitting line group and the pad part are disposed on a lower surface of the second layer, and
wherein a lower surface of the first layer is in contact with an upper surface of the second layer.

10. The display apparatus of claim 9,
wherein the first signal transmitting line group is connected to the pad part disposed on the lower surface of the second layer through a first pad contact hole formed in the first layer and a second pad contact hole formed in the second layer.

11. The display apparatus of claim 9,
wherein the source driving chip is in contact with a first signal transmitting pattern disposed on the upper surface of the first layer, and
wherein the gate driving chip is in contact with a second signal transmitting pattern on the lower surface of the second layer.

12. The display apparatus of claim 9,
wherein the gate driving chip is disposed on the upper surface of the first layer and the source driving chip is disposed on the lower surface of the second layer.

13. The display apparatus of claim 3,
wherein the second signal transmitting line group is connected to the pad parts, crossing the first signal transmitting line group.

14. The display apparatus of claim 3,
wherein the gate driving chip and the source driving chip are disposed adjacent to each other in a horizontal direction in the flexible printed circuit board.

15. The display apparatus of claim 3,
wherein the gate driving chip and the source driving chip are disposed adjacent to each other in a vertical direction in the flexible printed circuit board.

16. The display apparatus of claim 1,
wherein the flexible printed circuit board comprises a base substrate on which a first signal transmitting line group, a second signal transmitting line group and a pad part are disposed, the pad part being connected to the display panel.

17. The display apparatus of claim 16,
wherein the gate driving chip and the source driving chip are in contact with a first signal transmitting pattern and a second signal transmitting pattern disposed on an upper surface of the base substrate.

18. A display apparatus comprising;
a display panel comprising a gate line and data line; and
a plurality of flexible printed circuit boards connected to one side of the display panel,
wherein each of the plurality of flexible printed circuit boards comprises a gate driving chip configured to apply a gate signal to the gate line and a source driving chip configured to apply a data voltage to the data line,
wherein each of the plurality of flexible printed circuit boards comprises;
  a first layer on which a first signal transmitting line group connected to the source driving chip to transmit the data voltage to the data line is disposed; and
  a second layer on which a second signal transmitting line group connected to the gate driving chip to transmit the gate signal to the gate line disposed,
wherein the first layer and the second layer are different from each other, and
wherein the first signal transmitting line group and the second signal transmitting line group are overlapped,
wherein the gate line includes a first gate line, a second gate line and a third gate line,
wherein a first area of the display panel is driven by the first gate line extending in an inclined direction,
wherein a second area of the display panel is driven by the second gate line extending in a vertical direction crossing the inclined direction at a predetermined angle and the third gate line which extending in parallel to the inclined direction, and
wherein the predetermined angle is an acute angle between the inclined direction and the vertical direction.

19. The display apparatus of claim 18,
wherein the data line of the display panel extends in the vertical direction.

\* \* \* \* \*